(12) United States Patent
Cheng (10) Patent No.: US 11,119,671 B2
(45) Date of Patent: Sep. 14, 2021

(54) METHOD FOR FACILITATING A MEMORY SYSTEM OPERABLE IN ADVANCE DURING POWER-UP, MEMORY CONTROLLER THEREFOR, AND MEMORY SYSTEM CAPABLE OF BEING OPERABLE IN ADVANCE DURING POWER-UP

(71) Applicant: ELITE SEMICONDUCTOR MEMORY TECHNOLOGY INC., Hsinchu (TW)

(72) Inventor: Teng-Chuan Cheng, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 71 days.

(21) Appl. No.: 16/791,263

(22) Filed: Feb. 14, 2020

(65) Prior Publication Data

US 2021/0255787 A1    Aug. 19, 2021

(51) Int. Cl.
| | | |
|---|---|---|
| *G11C 16/30* | (2006.01) | |
| *G06F 3/06* | (2006.01) | |
| *G11C 5/14* | (2006.01) | |
| *G11C 16/04* | (2006.01) | |

(52) U.S. Cl.
CPC .......... *G06F 3/0632* (2013.01); *G06F 3/0604* (2013.01); *G06F 3/0679* (2013.01); *G11C 5/148* (2013.01); *G11C 16/30* (2013.01); *G11C 16/0483* (2013.01)

(58) Field of Classification Search
CPC .... G06F 3/0632; G06F 3/0679; G06F 3/0604; G11C 5/148; G11C 16/30; G11C 16/0483

USPC ..................................................... 365/63, 226
See application file for complete search history.

(56) References Cited

U.S. PATENT DOCUMENTS

| | | | |
|---|---|---|---|
| 5,774,409 A * | 6/1998 | Yamazaki | ........... G06F 12/0215 |
| | | | 365/230.03 |
| 5,893,168 A | 4/1999 | Qureshi et al. | |
| 6,384,634 B1 * | 5/2002 | Brissette | .................... G06F 5/14 |
| | | | 326/40 |
| 9,651,600 B2 | 5/2017 | Batt | |
| 10,169,518 B1 * | 1/2019 | Iyer | ........................ G06F 30/392 |
| 10,295,977 B2 * | 5/2019 | Amirthasamy | ...... G05B 19/042 |
| 10,354,038 B1 * | 7/2019 | Iyer | ........................ G06F 30/398 |
| 10,819,680 B1 * | 10/2020 | Santan | ................ H04L 63/0254 |

(Continued)

*Primary Examiner* — Michael T Tran
(74) *Attorney, Agent, or Firm* — Schmeiser, Olsen & Watts, LLP (57) ABSTRACT

A method facilitating a memory system operable in advance during power-up is introduced, including the following. A power-up verification circuit is provided, internally coupled to a memory control circuit of the memory system. During a period of the power-up in which a power voltage signal is ramping but not yet reaching a power voltage threshold, a power-up verification state machine of the power-up verification circuit is activated responsive to a power-on reset signal and the power voltage signal. The activated power-up verification state machine communicates with circuit units of the memory system to enable execution of corresponding detections on the circuit units in accordance with a sequence of states of the power-up verification state machine. After completion of the sequence of states, a verification completion signal is sent to enable the memory control circuit to be powered by the power voltage signal and operable to control the memory system.

18 Claims, 7 Drawing Sheets

(56) References Cited

U.S. PATENT DOCUMENTS

| | | | |
|---|---|---|---|
| 2003/0196143 A1* | 10/2003 | Puri | G11C 29/4401 |
| | | | 714/30 |
| 2007/0113277 A1* | 5/2007 | Chiang | G06F 12/1466 |
| | | | 726/18 |
| 2007/0157015 A1* | 7/2007 | Swanson | G06F 9/4401 |
| | | | 713/2 |
| 2007/0266447 A1* | 11/2007 | Hollander | G06F 21/32 |
| | | | 726/34 |
| 2014/0035650 A1* | 2/2014 | Zerbe | H03K 3/0315 |
| | | | 327/299 |
| 2014/0279795 A1* | 9/2014 | Shibuya | G06N 5/02 |
| | | | 706/46 |
| 2018/0349608 A1* | 12/2018 | de Cesare | G06F 21/575 |
| 2019/0004818 A1* | 1/2019 | Wu | G06F 1/3287 |
| 2019/0188388 A1* | 6/2019 | Kobayashi | G06F 21/554 |
| 2019/0342971 A1* | 11/2019 | Zou | H05B 47/20 |
| 2020/0153245 A1* | 5/2020 | Jakobsson | H02J 3/14 |
| 2021/0011080 A1* | 1/2021 | Narwal | G01R 31/3173 |

\* cited by examiner

METHOD FOR FACILITATING A MEMORY SYSTEM OPERABLE IN ADVANCE DURING POWER-UP, MEMORY CONTROLLER THEREFOR, AND MEMORY SYSTEM CAPABLE OF BEING OPERABLE IN ADVANCE DURING POWER-UP

BACKGROUND OF THE INVENTION

1. Field of the Invention

The present disclosure relates to a memory system, and in particular to a method for facilitating a memory system operable in advance during power-up, a memory controller thereof, and a memory system capable of being operable in advance during power-up.

2. Description of the Related Art

Non-volatile memory such as flash memory is indispensable to electronic devices such as smart phones, tablet computers, wearable devices, sensory devices and so on. In order to meet the requirements of users' demands and to facilitate better user experience, the electronic devices require low power consumption, fast data transfer and robust, high-reliability operation.

There is an increasing tendency for memory systems to operate under ultra-low voltages, for example, in order to extend battery life for the electronic devices. In addition, the memory system, such as flash memory, is required to operate under powering of ultra-low voltage during power-up as early as possible so as to minimize power-up latency of the electronic device employing the memory system.

It is noticed that under powering of ultra-low voltage during power-up, the memory controller of the memory system may not operate properly or might fail in case of unstable power or internal circuitry failure. As such, it would be challenging to automatically enable the memory system, such as flash memory, to operate under powering of ultra-low voltage during power-up as early as possible.

BRIEF SUMMARY OF THE INVENTION

An objective of the present disclosure is to provide technology for facilitating a memory system operable in advance during power-up.

To achieve the above objective, the present disclosure provides a method for facilitating a memory system operable in advance during power-up. The method includes the following steps of: providing a power-up verification circuit internally coupled to a memory control circuit of the memory system; during a period of the power-up in which a power voltage signal is ramping but not yet reaching a power voltage threshold for stably powering the memory system, activating, by the power-up verification circuit, a power-up verification state machine of the power-up verification circuit responsive to a power-on reset signal and the power voltage signal, wherein the power-up verification state machine has a sequence of states; communicating, by the activated power-up verification state machine, with a plurality of circuit units of the memory system to enable execution of corresponding detections on the circuit units in accordance with the sequence of the states, wherein the power-up verification state machine completes the sequence of states when all of the detections are passed in accordance with the sequence of the states; and after the power-up verification state machine completes the sequence of states, sending, by the power-up verification circuit, a verification completion signal to the memory control circuit to enable the memory control circuit to be powered by the power voltage signal and operable to control the memory system.

In some embodiments, before the sending of the verification completion signal to the memory control circuit, the memory control circuit is inoperable; and the verification completion signal enables the memory control circuit to be powered by the power voltage signal and operable to control the memory system, regardless of whether the power voltage signal does not reach the power voltage threshold.

In an embodiment, in the step of communicating, by the power-up verification state machine activated, with the plurality of circuit units of the memory system, the power-up verification state machine transitions from a first one of the states to a second one of the states when the first one of the states and any state previous to the first one of the states are passed in accordance with the sequence of states and any detection corresponding to the first one of the states is passed.

In an embodiment, in the step of communicating, by the power-up verification state machine activated, with the plurality of circuit units of the memory system, the corresponding detections on the circuit units are activated in accordance with the sequence of states and corresponding results of the detections from the circuit units are received in accordance with the sequence of states.

To achieve the above objective, the present disclosure provides a memory controller for facilitating a memory system operable in advance during power-up. The memory controller comprises a memory control circuit and a power-up verification circuit. The memory control circuit includes a processing unit. The power-up verification circuit, coupled to the memory control circuit, includes a power-up verification state machine having a sequence of states, wherein during a period of the power-up in which a power voltage signal is ramping but not yet reaching a power voltage threshold for stably powering the memory system, the power-up verification circuit activates the power-up verification state machine responsive to a power-on reset signal and the power voltage signal. The activated power-up verification state machine communicates with a plurality of circuit units of the memory system to enable execution of corresponding detections on the circuit units in accordance with the sequence of the states, wherein the power-up verification state machine completes the sequence of states when all of the detections are passed in accordance with the sequence of the states. After the power-up verification state machine completes the sequence of states, the power-up verification circuit sends a verification completion signal to the memory control circuit to enable the memory control circuit to be powered by the power voltage signal and operable to control the memory system.

To achieve the above objective, the present disclosure provides a memory system capable of being operable in advance during power-up. The memory system comprises a plurality of circuit units, a memory control circuit, and a power-up verification circuit. The power-up verification circuit, coupled to the memory control circuit, includes a power-up verification state machine having a sequence of states, wherein during a period of the power-up in which a power voltage signal is ramping but not yet reaching a power voltage threshold for stably powering the memory system, the power-up verification circuit activates the power-up verification state machine responsive to a power-on reset signal and the power voltage signal. The activated power-up verification state machine communicates with the circuit units to enable execution of corresponding detections on the circuit units in accordance with the sequence of the states, wherein the power-up verification state machine completes the sequence of states when all of the detections are passed in accordance with the sequence of the states. After the power-up verification state machine completes the sequence of states, the power-up verification circuit sends a verification completion signal to the memory control circuit to enable the memory control circuit to be powered by the power voltage signal and operable to control the memory system.

In some embodiments of the memory controller or memory system, the memory control circuit is inoperable before receiving the verification completion signal; and the verification completion signal enables the memory control circuit to be powered by the power voltage signal and operable to control the memory system, regardless of whether the power voltage signal does not reach the power voltage threshold.

In some embodiments of the memory controller or memory system, the power-up verification state machine transitions from a first one of the states to a second one of the states when the first one of the states and any state previous to the first one of the states are passed in accordance with the sequence of states and any detection corresponding to the first one of the states is passed.

In some embodiments of the memory controller or memory system, the power-up verification state machine activates the corresponding detections on the circuit units in accordance with the sequence of states and receives corresponding results of the detections from the circuit units in accordance with the sequence of states.

In some embodiments of the memory controller or memory system, the memory system is a non-volatile memory system.

In some embodiments of the memory controller or memory system, the memory system is a flash-based memory system.

As such, the embodiments of a method and memory controller for facilitating a memory system operable in advance during power-up, and a memory system capable of being operable in advance during power-up are provided.

DETAILED DESCRIPTION OF THE INVENTION

To facilitate understanding of the object, characteristics and effects of this present disclosure, embodiments together with the attached drawings for the detailed description of the present disclosure are provided.

Figure 1:
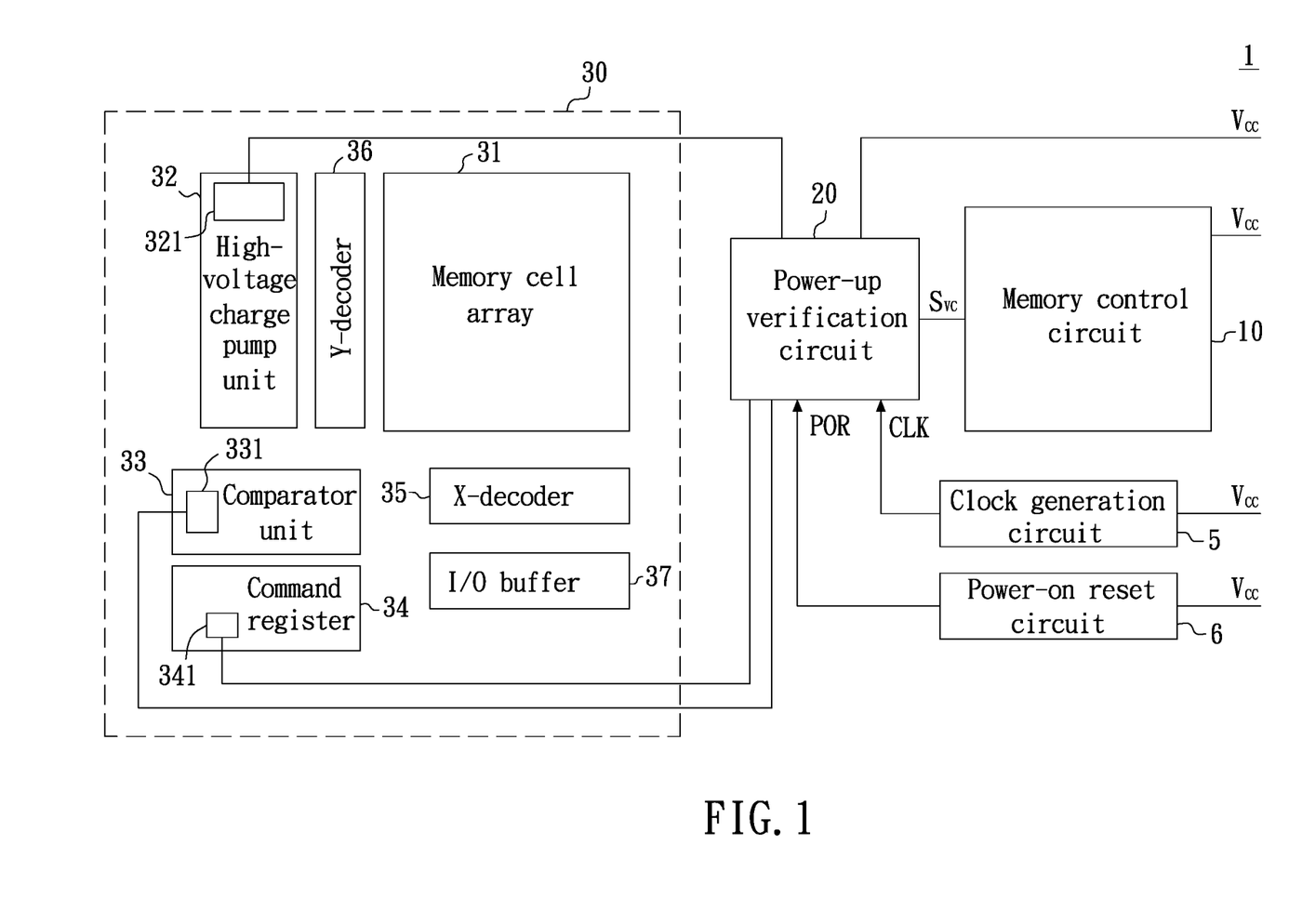
FIG. 1 is a schematic diagram illustrating a memory system capable of being operable in advance during power-up according to embodiments of the present disclosure.

Referring to FIG. 1, a memory system capable of being operable in advance during power-up is illustrated according to embodiments of the present disclosure in a schematic diagram form. As shown in FIG. 1, a memory system 1 includes a memory control circuit 10, and a power-up verification circuit 20, and a plurality of circuit units 30.

In some embodiments, the memory system 1 is a non-volatile memory system, such as a flash-based memory system. Hence, the circuit units 30 indicate any circuits for purpose of storing or reading data of the memory system 1, such as a memory cell array 31, a high-voltage charge pump unit 32, a comparator unit 33, a command register 34, a X-decoder 35, a Y-decoder 36, an I/O buffer 37, and so on. Certainly, the implementation of the invention is not limited to the above examples. The circuit units 30 as in FIG. 1 are shown for the sake of illustration.

The memory control circuit 10, for example, may be implemented as or include a processing unit, a microcontroller, or programmable circuit such as field-programmable gate array (FPGA) or application-specific integrated circuit (ASIC). In some embodiments, the memory control circuit 10 may be any memory control unit for a given memory system, such as a NAND flash memory system, wherein the memory control unit is configured to be operable under powering of a power voltage signal $V_{CC}$ which is required to be at a stable voltage level within a tolerable range. If the power voltage signal $V_{CC}$ is at a voltage level below the tolerable range, the memory control unit may be in an unstable state, in particular, during power-up.

The power-up verification circuit 20, coupled to the memory control circuit 10, is capable of facilitating the memory system 1 operable in advance during power-up, as will be illustrated later by way of embodiments.

In some embodiments, the memory control circuit 10 and power-up verification circuit 20 can be regarded as, or included in, a memory controller provided for facilitating the memory system 1 operable in advance during power-up. For example, the power-up verification circuit 20 may be implemented as a portion of the memory controller including the memory control circuit 10. Certainly, the implementation of the invention is not limited to the above examples.

Figure 2:
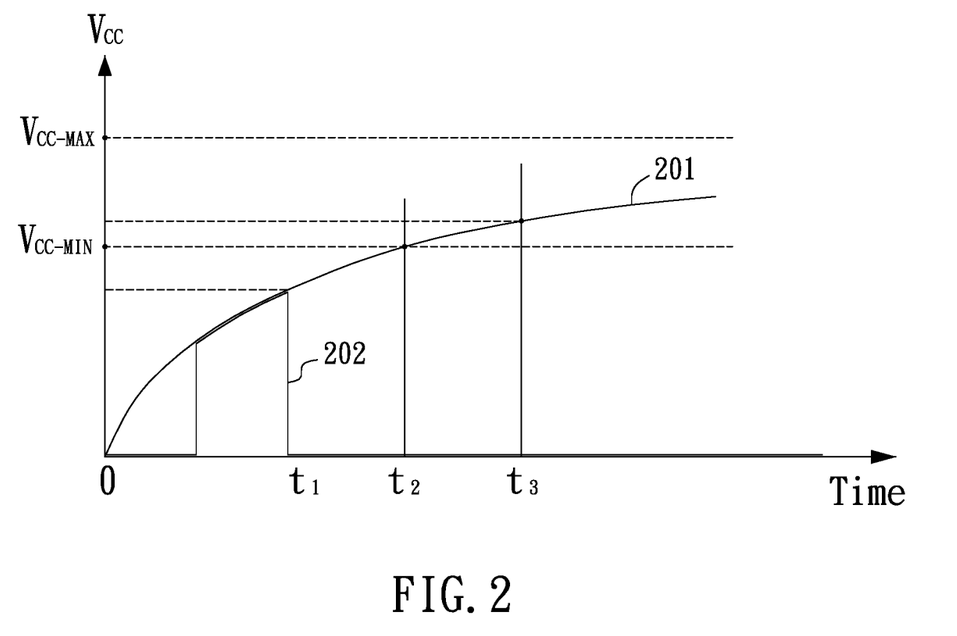
FIG. 2 is a schematic diagram illustrating an example of a power voltage signal ramping and a power-up reset signal during power-up of the memory system of FIG. 1.

Referring to FIG. 2, an example of a power voltage signal $V_{CC}$ ramping and a power-up reset signal during power-up of the memory system 1 of FIG. 1 is illustrated in a schematic diagram form. As shown in FIG. 2, the power voltage signal $V_{CC}$, indicated by a curve 201, is ramping from zero to a stable voltage level after a period of time $t_3$ when the power voltage signal $V_{CC}$ is within a minimum power voltage signal $V_{CC}$ (indicated by $V_{CC\text{-}MIN}$) and a maximum power voltage signal $V_{CC}$ (indicated by $V_{CC\text{-}MAX}$). Hence, it is generally supposed that in order to enable stable and reliable operation of the memory system 1, the memory control circuit 10 of the memory system 1 should be allowed to be powered by the power voltage signal $V_{CC}$ after a period of time $t_3$.

However, in some scenarios of practical applications, an earlier activation may be required so that the memory control circuit 10 of the memory system 1 is required to be powered by the power voltage signal $V_{CC}$ before the period of time $t_3$. For example, the memory control circuit 10 of the memory system 1 may be required to be powered by the power voltage signal $V_{CC}$ before the period of time $t_2$ when the power voltage signal $V_{CC}$ is ramping and not yet reaching the voltage level of the minimum power voltage signal $V_{CC}$ ($V_{CC\text{-}MIN}$). In this way, the memory control circuit 10 of the memory system 1 may be required to be powered in advance during the power-up in order to make the whole memory system 1 ready to operate, thus reducing power-up latency of an electronic device employing the memory system 1.

It is noticed that under powering of the voltage level below the minimum power voltage signal $V_{CC}$ ($V_{CC\text{-}MIN}$) during power-up, the memory control circuit 10 of the memory system 1 may not operate properly or might fail. The following provides embodiments for facilitating the memory system 1 operable in advance during power-up.

Figure 3:
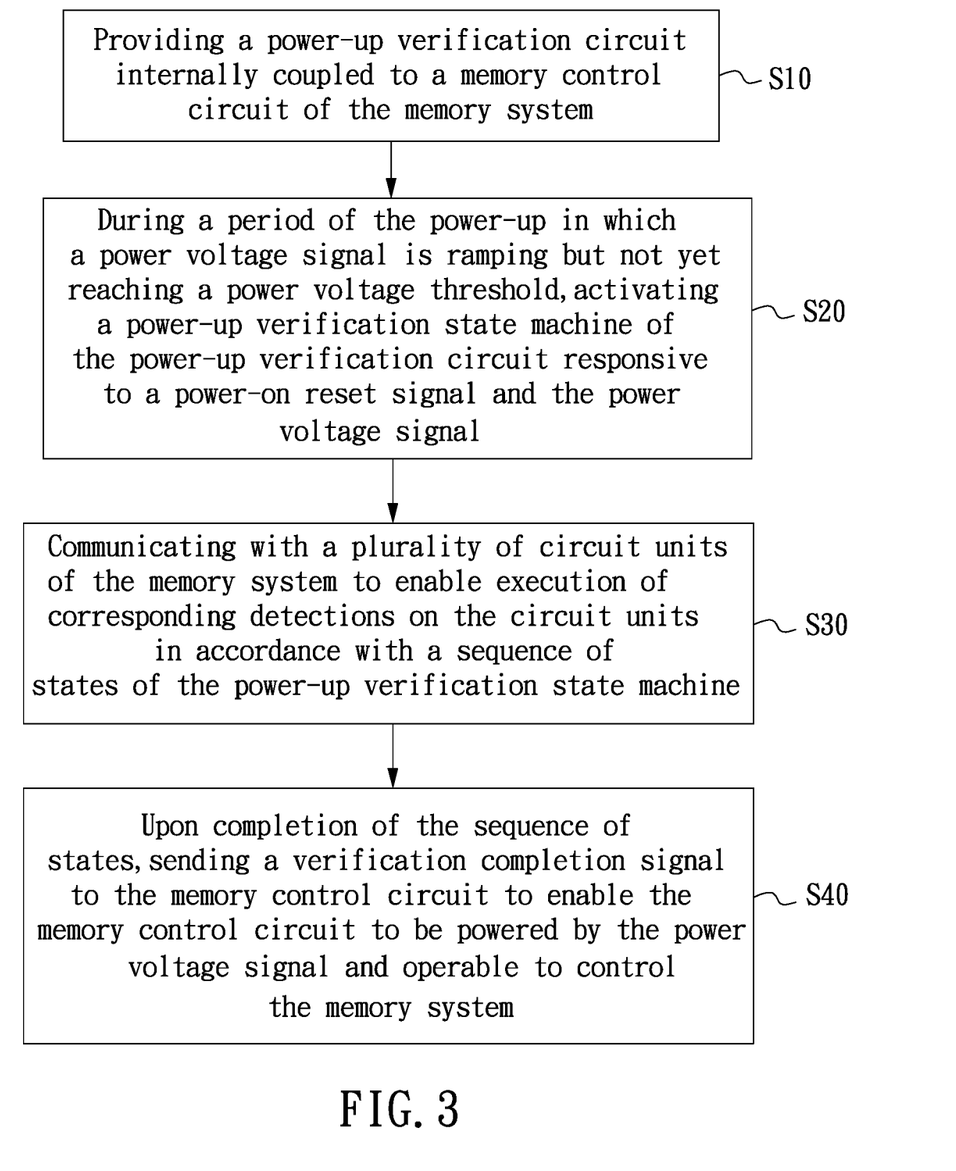
FIG. 3 is a flowchart illustrating a method capable of facilitating a memory system operable in advance during power-up according to an embodiment of the present disclosure.

Referring to FIG. 3, a method for facilitating a memory system operable in advance during power-up is illustrated according to an embodiment of the present disclosure in a flowchart form. As shown in FIG. 3, the method includes steps S10-S40, for example.

As shown in step S10, a power-up verification circuit 20 internally coupled to a memory control circuit 10 of the memory system 1 is provided.

As shown in step S20, during a period of the power-up in which a power voltage signal $V_{CC}$ is ramping but not yet reaching a power voltage threshold for stably powering the memory system 1, a power-up verification state machine of the power-up verification circuit 20 is activated by the power-up verification circuit 20, responsive to a power-on reset signal POR and the power voltage signal $V_{CC}$. The power-up verification state machine has a sequence of states.

As shown in step S30, the activated power-up verification state machine communicates with the circuit units 30 of the memory system 1 to enable execution of corresponding detections on the circuit units 30 in accordance with the sequence of the states, wherein the power-up verification state machine completes the sequence of states when all of the detections are passed in accordance with the sequence of the states.

As shown in step S40, after the power-up verification state machine completes the sequence of states, the power-up verification circuit 20 sends a verification completion signal $S_{VC}$ to the memory control circuit 10 to enable the memory control circuit 10 to be powered by the power voltage signal $V_{CC}$ and operable to control the memory system 1.

Hence, the memory system 1 can be enabled in advance during power-up by using the method as shown above. The following provides some embodiments of steps of the method of FIG. 3.

Regarding step S10, for example, the power-up verification circuit 20 is connected between the memory control circuit 10 and circuit units 30, as illustrated in FIG. 1.

In step S20, for example, the power-on reset signal POR, indicated by a curve 202, may be generated by a power-on reset circuit 6 of the memory system 1, in response to the power voltage signal $V_{CC}$ which is ramping, as shown in FIGS. 1 and 2. Upon receiving the power-on reset signal POR, the power-up verification circuit 20, powered by the power voltage signal $V_{CC}$, starts to operate while the memory control circuit 10 is still inoperable. Meanwhile, the power-up verification circuit 20 may also receive a clock signal CLK from a clock generation circuit 5 powered by the power voltage signal $V_{CC}$. Alternatively, the power-up verification circuit 20 may include an oscillator powered by the power voltage signal $V_{CC}$ to provide a clock signal internally.

Figure 4:
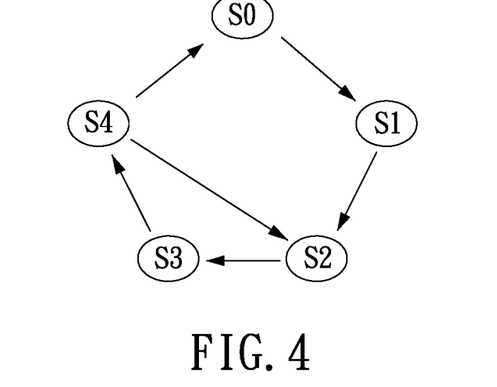
FIG. 4 is a schematic diagram illustrating an example of a power-up verification state machine of the power-up verification circuit for the memory system of FIG. 1.

In step S20, for example, the power-up verification circuit 20 can be configured to implement the power-up verification state machine having a sequence of states, S0, S1, S2, S3, S4, as illustrated in FIG. 4. Each of states has corresponding detection to be performed and checked.

In an embodiment, in the step S30, the corresponding detections on the circuit units 30 are activated in accordance with the sequence of states and corresponding results of the detections from the circuit units 30 are received in accordance with the sequence of states. For the embodiment, for example, in accordance with the sequence of states, S0 indicates a start of the sequence and S4 indicates an end of the sequence. In the state S1, a corresponding one of the circuit units 30, such as the high-voltage charge pump unit 32, can be selected to perform a corresponding detection. It is supposed that the selected circuit unit (such as the high-voltage charge pump unit 32, comparator unit 33, or command register 34) includes (or is associated with) a detection circuit (e.g., a detection circuit 321, 331, or 341) which may be implemented with a detection circuit for performing detection (e.g., functional testing) of the selected circuit unit and/or a recovery circuit for performing recovery (e.g., resetting) of the selected circuit, in addition to circuitry for the selected circuit unit's own functionality, such as a high-voltage charge pump circuit. Hence, in the step S30, for example, the power-up verification circuit 20 can send a detection request signal to the selected circuit unit, such as the high-voltage charge pump unit 32, when the current state is required to enable execution of a corresponding detection on the selected circuit unit. In this example, the selected circuit unit, such as the high-voltage charge pump unit 32, after the execution of the detection, can send a detection result signal to the power-up verification circuit 20. The detection result signal indicates the result of the detection of the selected circuit unit, which may be passed or failed. The power-up verification state machine then checks the result and determines what to do in accordance with the sequence of the states. For example, if the detection of a selected circuit unit that has both detection and recovery circuit is failed, the power-up verification state machine may trigger the reset of the selected circuit unit to perform recovery function. The selected circuit unit may also reset by itself after the detection is failed. Certainly, the implementation of the invention is not limited to the above examples.

In an embodiment, in the step S30, the power-up verification state machine transitions from a first one of the states to a second one of the states when the first one of the states and any state previous to the first one of the states are passed in accordance with the sequence of states and any detection corresponding to the first one of the states is passed. For the embodiment, for example, indicators, such as flags, may be utilized to ensure the states going through in accordance with the sequence correctly, as illustrated in TABLE 1 below.

TABLE 1

| State | Flags to record states which have been gone through |
|---|---|
| S0 | — |
| S0 (S4 to S0 if S4 is failed) | S0, S1, S2, S3, S4 |
| S1 | S1 |
| S2 | S1, S2 |
| S2 (S4 to S2 if S4 is failed) | S1, S2, S3, S4, S2' |
| S3 | S1, S2, S3 |
| S4 | S1, S2, S3, S4 |

The power-up verification state machine may set the flag for the corresponding state to "1" when passed or to "0" when failed. As shown in TABLE 1, for example, in the state S3, the power-up verification state machine transitions from the state S3 to the state S4 when the state S3 and any state previous to the state S3 (i.e., S1, S2) are passed in accordance with the sequence of states and any detection corresponding to the first one of the states is passed. The other state transition is also performed in a similar manner.

Figure 5:
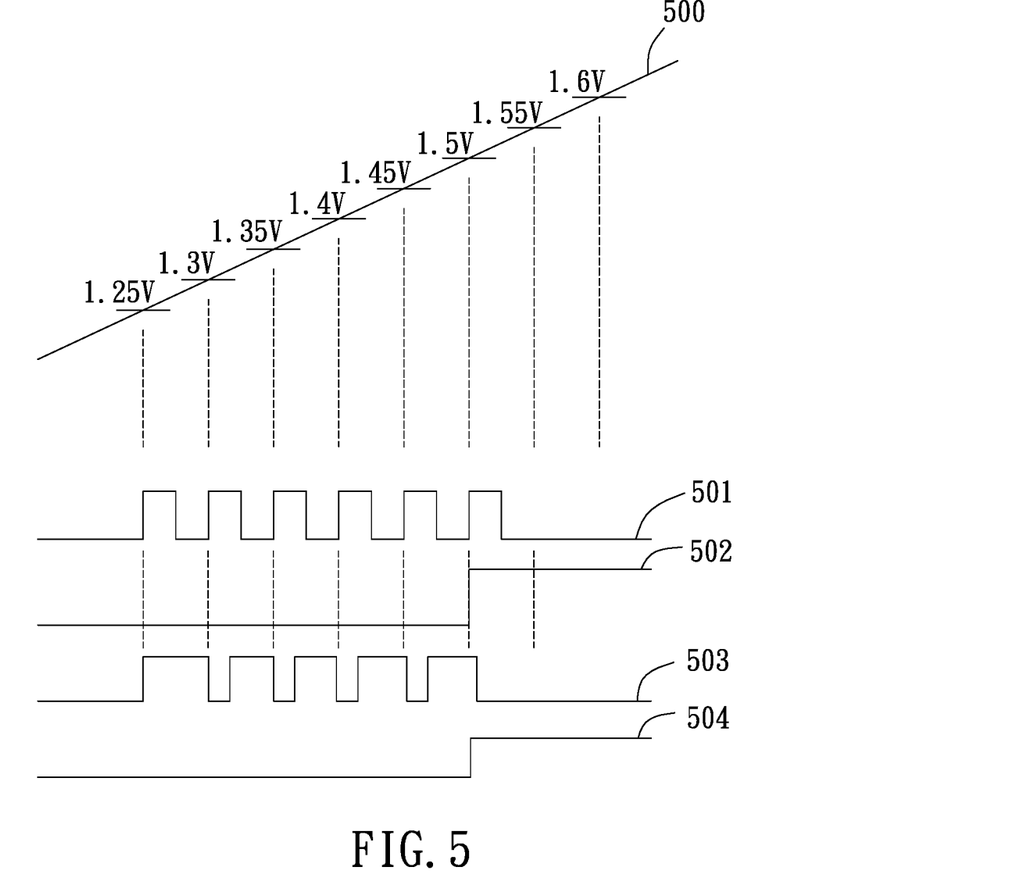
FIG. 5 is a schematic diagram illustrating an example of internal signals and an output signal of the power-up verification state machine of FIG. 4 during a period of power-up in which a power voltage signal is ramping.

Referring to FIG. 5, an example of internal signals and an output signal of the power-up verification state machine of FIG. 4 is illustrated during a period of power-up in which a power voltage signal $V_{CC}$ is ramping. As shown in FIG. 5, the power voltage signal $V_{CC}$, indicated by a curve 500, is ramping from 1.25V to 1.6V. In FIG. 5, a check point signal, indicated by a curve 501, has its pulse corresponding to a check point indicating that a path of the power-up verification state machine is completed, wherein the path may be a correct path (e.g., S0, S1, S2, S3, S4) or an incorrect path (e.g., S0, S1, S3). In addition, at any check point, the power-up verification state machine is executed in accordance with the sequence of states of FIG. 4. If an incorrect path occurs, in which the states are not gone through in accordance with the sequence of states, the power-up verification state machine may initiate a reset function, indicated by a curve 503 (which is shown not to scale and for illustration only) to make the power-up verification state machine reset, starting from the state S0. When the sequence of the states is completed, the verification completion signal, indicated by a curve 502, is asserted and is sent to the memory control circuit 10. Accordingly, a signal, indicated by a curve 504, indicates that the memory control circuit 10 is operating. Thus, the memory control circuit 10 is facilitated to operate in advance during the power-up when the power voltage signal $V_{CC}$ is at the voltage level of about 1.5V, which is below the minimum power voltage signal $V_{CC}$ (indicated by $V_{CC-MIN}$), for example, 1.65V. Further, the time period for the power voltage signal $V_{CC}$ increasing from 1.25V to 1.6V may be about 100 ms to 200 ms (or other time value), for example. Certainly, the implementation of the invention is not limited to the above examples.

In some embodiments, before the sending of the verification completion signal to the memory control circuit 10, the memory control circuit 10 is inoperable; and the verification completion signal enables the memory control circuit 10 to be powered by the power voltage signal $V_{CC}$ and operable to control the memory system 1, regardless of whether the power voltage signal $V_{CC}$ does not reach the power voltage threshold.

Figure 6:
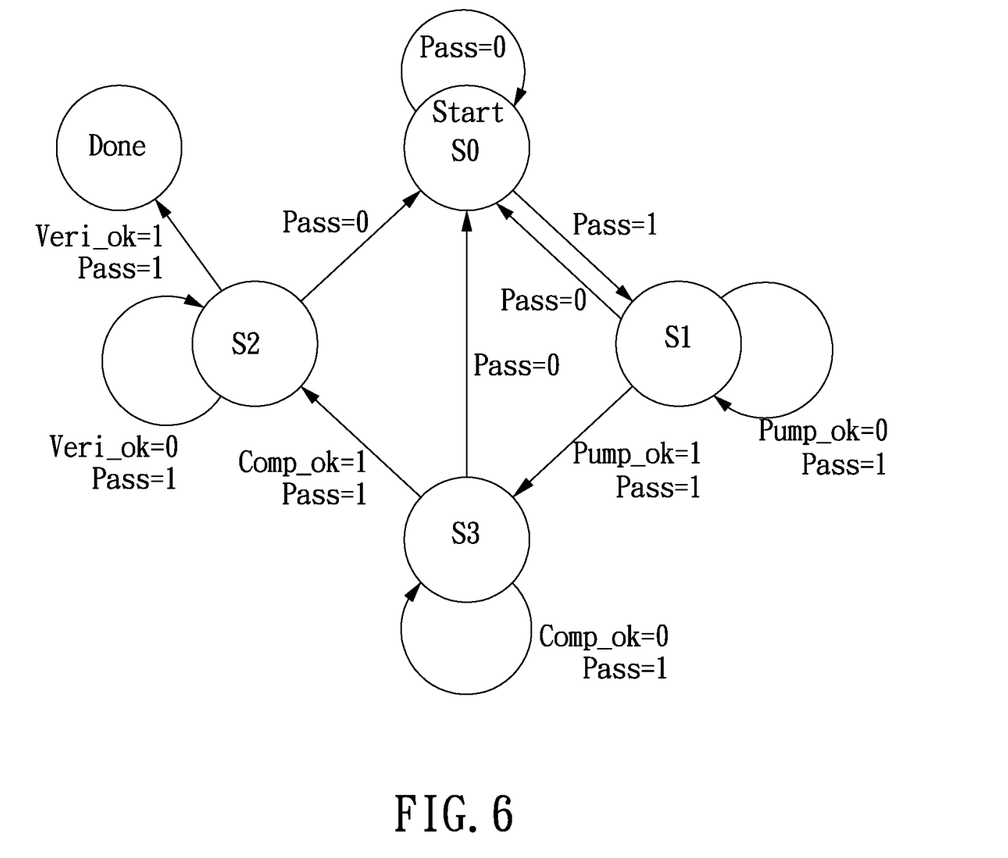
FIG. 6 is a schematic diagram illustrating an example of a power-up verification state machine of the power-up verification circuit for the memory system of FIG. 1.

Referring to FIG. 6, an example of a power-up verification state machine of the power-up verification circuit 20 for the memory system of FIG. 1 is illustrated in a schematic diagram form. In this example, the power-up verification state machine has a sequence of states, S0, S1, S3, S2, wherein S0 indicates a start and S2 indicates an end. For ensuring of the states being gone through in accordance with the sequence correctly, a plurality of state flags, such as Flag1, Flag3, Flag2, may be utilized to indicate whether each of the states S1, S3, S2 is passed or not. In addition, a plurality of detection flags, such as indicated by Pump_ok, Comp_ok, Veri_ok, are employed to indicate whether each of the detections of some circuit units is passed or not.

The state S0 can be associated with system power-on. For example, when the power-up verification circuit 20 receives the power-on reset signal POR (being asserted), the power-up verification state machine starts at the state S0. In the state S0, all state flags are set to 0 initially. The power-up verification state machine then checks whether all of the state flags are equal to 0. If so, a pass flag is set to 1 and the state is transitions from S0 to S1. Otherwise, the pass flag is set to 0 and the process for the state S0 is repeated.

The state S1 can be associated with checking of at least one of the circuit units 30, such as a circuit unit for high-voltage generation. In the state S1, the corresponding state flag Flag1 is set to 1 and, for example, a detection of the high-voltage charge pump unit 32 is to be performed. It is checked whether the detection is passed or not. If the detection result is passed, the detection flag Pump_ok is set to 1; otherwise, Pump_ok is set to 0. If the detection flag Pump_ok indicates 1, it is then checked whether the state flags Flag1, Flag3, Flag2 indicate 1, 0, 0 respectively. If so, the pass flag is set to 1 and the state is transitions from S1 to S3; if not, the pass flag is set to 0.

The state S3 can be associated with checking of at least one of the circuit units 30, such as a circuit unit for comparison. In the state S3, the corresponding state flag Flag3 is set to 1 and, for example, a detection of a selected circuit unit, for example, the comparator unit 33 is to be performed. It is checked whether the detection is passed or not. If the detection result is passed, the detection flag Comp_ok is set to 1; otherwise, Comp_ok is set to 0. If the detection flag Comp_ok indicates 1, it is then checked whether the state flags Flag1, Flag3, Flag2 indicate 1, 1, 0 respectively. If so, a pass flag is set to 1 and the state is transitions from S3 to S2; if not, the pass flag is set to 0.

The state S2 can be associated with checking of at least one of the circuit units 30, such as some circuit units for read data verification. In the state S2, the corresponding state flag Flag2 is set to 1 and, for example, a detection of verification of a test data read from the memory cell array 31 (e.g., reading of a few data bits and then the read data are verified) is performed. It is checked whether the detection is passed or not. If the detection result is passed, the detection flag Veri_ok is set to 1; otherwise, Veri_ok is set to 0. If the detection flag Veri_ok indicates 1, it is then checked whether the state flags Flag1, Flag3, Flag2 indicate 1, 1, 1 respectively. If so, the pass flag is set to 1 and the state comes to an end; if not, the pass flag is set to 0.

Hence, as shown in FIG. 6, the power-up verification state machine transitions from a current state (e.g., S3) to a next state (e.g., S2) when the current state (e.g., S3) and any state previous to the current state (i.e., S0, S3, S1) are passed in accordance with the sequence of states and any detection corresponding to the current state (e.g., S3) is passed. At last, after all of the detection are passed (i.e., detections associated with S1, S3, S2) and all of the states are passed (i.e., S0, S1, S3, S2), the power-up verification state machine sends the verification completion signal to the memory control circuit 10. Regarding the above criteria in implementation, the power-up verification state machine as shown in FIG. 6 utilizes the checking of the state flags in each state, thus enhancing the reliability of the power-up verification state machine during the period of the power-up. During the period of power-up, the power voltage signal $V_{CC}$, clock signal and so on may be still not stable enough for correct operations of a portion of logic components for implementing the power-up verification state machine, in which undesirable or intermittent operations may occur.

Figure 7:
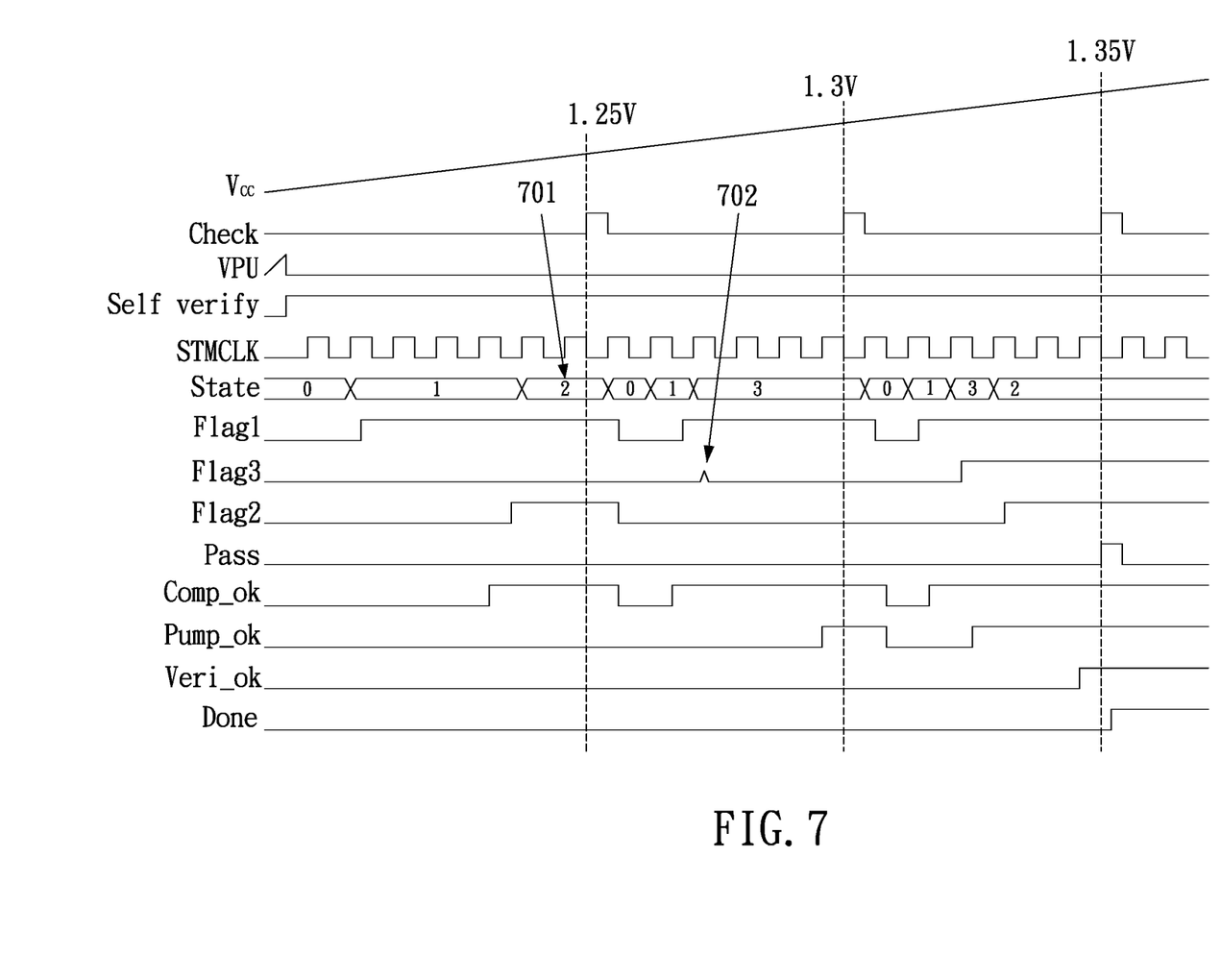
FIG. 7 is a schematic diagram illustrating an example of internal signals and an output signal of the power-up verification state machine of FIG. 6 during a period of power-up in which a power voltage signal is ramping.

The power-up verification state machine as exemplified above is capable of making error detection and recovery functionality. FIG. 7 illustrates an example of internal signals and an output signal of the power-up verification state machine of FIG. 6 during a period of power-up in which a power voltage signal $V_{CC}$ is ramping. In FIG. 7, a signal denoted by "Check" indicates that the check point signal (e.g., curve 501 in FIG. 5); a signal denoted by "VPU" indicates that the power-on reset signal POR is enabled; a signal denoted by "Self Verify" indicates that the power-up verification state machine is enabled; a signal denoted by "STMCLK" indicates a clock signal employed internally; a signal denoted by "State" indicates the current state; signals denoted by "Flag1", "Flag3", "Flag2" indicate values of the state flags Flag1, Flag3, Flag2, respectively; a signal denoted by "Pass" indicates a pass signal employed internally; signals denoted by "Pump_ok", "Comp_ok", "Veri_ok", indicate values of the detection flags Pump_ok, Comp_ok, Veri_ok, respectively; a signal denoted by "Done" indicates the power-up verification state machine reaches its end, i.e. the "Done" state in FIG. 6, where the "Done" signal may be employed as the verification completion signal $S_{VC}$. In an example, if the state of the power-up verification state machine of FIG. 6 jumps to an incorrect state, such as one indicated by an arrow 701, from S1 to S2 (where the waveform of "State" schematically indicates a transition from "1" (i.e. S1) to "2" (i.e., S2), not following the sequence of states as specified in FIG. 6, the power-up verification state machine is able to detect this incorrect transition and make recovery because at each state, all previous states are to be checked. In the above example of the state incorrectly jumping from S1 to S2 without going through S3 (Flag3 being "0"), referring to FIG. 6, in the state S2, the pass flag will be set to 0 because it is checked that the state flags Flag1, Flag3, Flag2 do not indicate 1, 1, 1 respectively, regardless of whether the detection flag Veri_ok is passed or not. The state will then transition from S2 to S0 such that the power-up verification state machine is reset. The power-up verification state machine may eventually arrive at the "Done" state of FIG. 6, as illustrated in FIG. 7 by the signal "Done" asserted, until the states are gone through correctly in accordance with the sequence of states (e.g., S0, S1, S3, S2) of FIG. 6. In this example, the memory control circuit 10 will be enabled to be powered by the power voltage signal $V_{CC}$ at about 1.35V and operable to control the memory system 1. Further, for other examples of incorrect path (e.g., state jumping incorrectly), the pass flag will be set to "0" and the power-up verification state machine will reset itself by way of transitioning from the current state (e.g., S1 or S3) to the start state (i.e., S0), as illustrated in FIG. 6. As such, the power-up verification state machine as shown in FIG. 6 utilizes the checking of the state flags in each state, thus enhancing the reliability of the power-up verification state machine during the period of the power-up.

In some embodiments, referring to FIG. 6, in one of the states (e.g., S1, S3, or S2), if the associated detection is failed, the detection flag (e.g., Pump_ok, Comp_ok, or Veri_ok) is set to "0". The power-up verification state machine then further checks whether the state flags (e.g., Flag1, Flag3, Flag2) indicate correct values respectively. For example, in the state S3, it is checked whether the state flags Flag1, Flag3, Flag2 indicate 1, 1, 0 respectively. If so, the pass flag is set to 1 and the state S3 is reset; if not, the pass flag is set to 0 and the state S3 transitions to the state S0 to reset the power-up verification state machine, as illustrated in FIG. 6. In another example, a state flag Flag3 experiences a mistake, such as a latch unstable state, indicated by an arrow 702 in FIG. 7, which will not affect the operation of the power-up verification state machine because of the checking of the previous states as illustrated above. Certainly, the implementation of the invention is not limited to the above examples.

Figure 8:
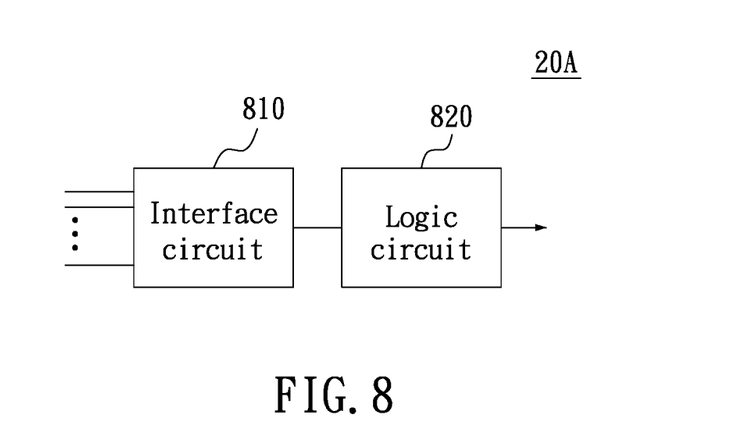
FIG. 8 is a schematic diagram illustrating an embodiment of the power-up verification circuit of FIG. 1.

FIG. 8 illustrates an embodiment of the power-up verification circuit of FIG. 1. The power-up verification circuit 20A may include an interface circuit 810 and a logic circuit 820. The interface circuit 810 is coupled to the circuit units 30 in response to the states that requires enabling execution of corresponding detections of the circuit units 30. The interface circuit 810 may activate one of the circuit units 30 and receives result of the detection from the one of circuit units 30. For example, in the state S1, the interface circuit 810 can be configured to send a corresponding detection request signal to the high-voltage charge pump unit 32 to enable execution of corresponding detections of the high-voltage charge pump unit 32. The interface circuit 810 can be configured to receive a detection result signal outputted by the high-voltage charge pump unit 32 after the execution of the detection. The interface circuit 810 applies a signal based on the detection result signal as an input signal to the logic circuit 820. The interface circuit 810 may be implemented by using any appropriate logic circuit components.

Figure 9:
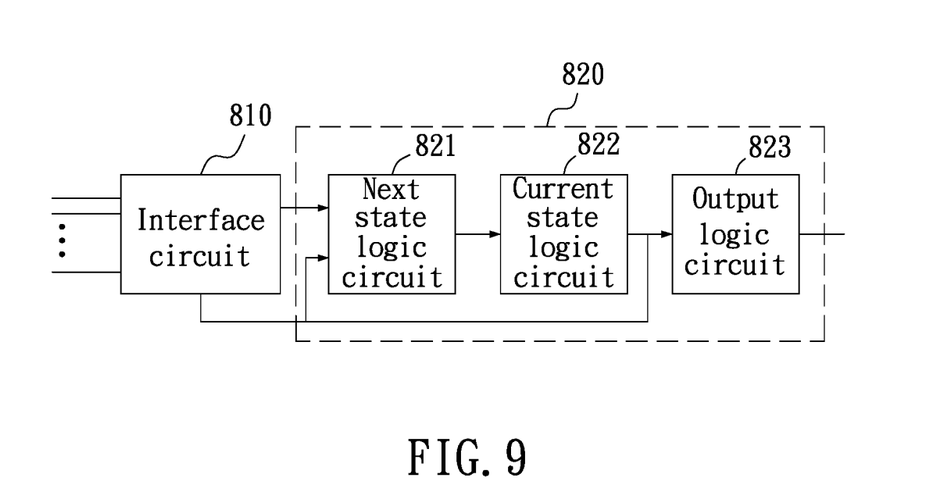
FIG. 9 is a schematic diagram illustrating an embodiment of the power-up verification circuit of FIG. 1.

FIG. 9 is a schematic diagram illustrating an embodiment of the power-up verification circuit of FIG. 1. In FIG. 9, the logic circuit 820 may include a next state logic circuit 821, a current state logic circuit 822, and an output logic circuit 823. Certainly, the implementation of the invention is not limited to the above examples. The power-up verification circuit 20 (or 20A) may be implemented by any digital, sequential, and combinational logic circuits. The power-up verification circuit 20 (or 20A) or the method based on FIG. 3 can be implemented in an electronic design automation (EDA) tool, for example, in a hardware description language (HDL) code such as Verilog.

In some embodiments of the memory controller or memory system, the memory control circuit 10 is inoperable before receiving the verification completion signal; and the verification completion signal enables the memory control circuit 10 to be powered by the power voltage signal $V_{CC}$ and operable to control the memory system 1, regardless of whether the power voltage signal $V_{CC}$ does not reach the power voltage threshold.

In some embodiments of the memory controller or memory system 1, the power-up verification state machine (e.g., 20 or 20A) transitions from a first one of the states to a second one of the states when the first one of the states and any state previous to the first one of the states are passed in accordance with the sequence of states and any detection corresponding to the first one of the states is passed.

In some embodiments of the memory controller or memory system 1, the power-up verification state machine (e.g., 20 or 20A) activates the corresponding detections on the circuit units 30 in accordance with the sequence of states and receives corresponding results of the detections from the circuit units 30 in accordance with the sequence of states.

As such, the embodiments of a method and memory controller facilitating a memory system operable in advance during power-up, and a memory system capable of being operable in advance during power-up are provided.

While the present disclosure has been described by way of specific embodiments, numerous modifications, combinations, and variations could be made thereto by those skilled in the art without departing from the scope and spirit of the present disclosure set forth in the claims.

What is claimed is:

1. A method for facilitating a memory system operable in advance during power-up, the method comprising:
providing a power-up verification circuit internally coupled to a memory control circuit of the memory system;
during a period of the power-up in which a power voltage signal is ramping but not yet reaching a power voltage threshold for stably powering the memory system, activating, by the power-up verification circuit, a power-up verification state machine of the power-up verification circuit responsive to a power-on reset signal and the power voltage signal, wherein the power-up verification state machine has a sequence of states;
communicating, by the activated power-up verification state machine, with a plurality of circuit units of the memory system to enable execution of corresponding detections on the circuit units in accordance with the sequence of the states, wherein the power-up verification state machine completes the sequence of states when all of the detections are passed in accordance with the sequence of the states; and
after the power-up verification state machine completes the sequence of states, sending, by the power-up verification circuit, a verification completion signal to the memory control circuit to enable the memory control circuit to be powered by the power voltage signal and operable to control the memory system.

2. The method according to claim 1, wherein before the sending of the verification completion signal to the memory control circuit, the memory control circuit is inoperable; and the verification completion signal enables the memory control circuit to be powered by the power voltage signal and operable to control the memory system, regardless of whether the power voltage signal does not reach the power voltage threshold.

3. The method according to claim 1, wherein in the step of communicating, by the power-up verification state machine activated, with the plurality of circuit units of the memory system, the power-up verification state machine transitions from a first one of the states to a second one of the states when the first one of the states and any state previous to the first one of the states are passed in accordance with the sequence of states and any detection corresponding to the first one of the states is passed.

4. The method according to claim 1, wherein in the step of communicating, by the power-up verification state machine activated, with the plurality of circuit units of the memory system, the corresponding detections on the circuit units are activated in accordance with the sequence of states and corresponding results of the detections from the circuit units are received in accordance with the sequence of states.

5. The method according to claim 1, wherein the memory system is a non-volatile memory system.

6. The method according to claim 5, wherein the memory system is a flash-based memory system.

7. A memory controller for facilitating a memory system operable in advance during power-up, the memory controller comprising:
a memory control circuit including a processing unit; and
a power-up verification circuit, coupled to the memory control circuit, including a power-up verification state machine having a sequence of states, wherein during a period of the power-up in which a power voltage signal is ramping but not yet reaching a power voltage threshold for stably powering the memory system, the power-up verification circuit activates the power-up verification state machine responsive to a power-on reset signal and the power voltage signal;
wherein the activated power-up verification state machine communicates with a plurality of circuit units of the memory system to enable execution of corresponding detections on the circuit units in accordance with the sequence of the states, wherein the power-up verification state machine completes the sequence of states when all of the detections are passed in accordance with the sequence of the states; and
wherein after the power-up verification state machine completes the sequence of states, the power-up verification circuit sends a verification completion signal to the memory control circuit to enable the memory control circuit to be powered by the power voltage signal and operable to control the memory system.

8. The memory controller according to claim 7, wherein the memory control circuit is inoperable before receiving the verification completion signal; and the verification completion signal enables the memory control circuit to be powered by the power voltage signal and operable to control the memory system, regardless of whether the power voltage signal does not reach the power voltage threshold.

9. The memory controller according to claim 7, wherein the power-up verification state machine transitions from a first one of the states to a second one of the states when the first one of the states and any state previous to the first one of the states are passed in accordance with the sequence of states and any detection corresponding to the first one of the states is passed.

10. The memory controller according to claim 7, wherein the power-up verification state machine activates the corresponding detections on the circuit units in accordance with the sequence of states and receives corresponding results of the detections from the circuit units in accordance with the sequence of states.

11. The memory controller according to claim 7, wherein the memory controller is used to control the memory system which is based on non-volatile memory.

12. The memory controller according to claim 11, wherein the memory system is a flash-based memory system.

13. A memory system capable of being operable in advance during power-up, the memory system comprising:
a plurality of circuit units;
a memory control circuit; and
a power-up verification circuit, coupled to the memory control circuit, including a power-up verification state machine having a sequence of states, wherein during a period of the power-up in which a power voltage signal is ramping but not yet reaching a power voltage threshold for stably powering the memory system, the power-up verification circuit activates the power-up verification state machine responsive to a power-on reset signal and the power voltage signal;
wherein the activated power-up verification state machine communicates with the circuit units to enable execution of corresponding detections on the circuit units in accordance with the sequence of the states, wherein the power-up verification state machine completes the sequence of states when all of the detections are passed in accordance with the sequence of the states; and
wherein after the power-up verification state machine completes the sequence of states, the power-up verification circuit sends a verification completion signal to the memory control circuit to enable the memory control circuit to be powered by the power voltage signal and operable to control the memory system.

14. The memory system according to claim 13, wherein the memory control circuit is inoperable before receiving the verification completion signal; and the verification completion signal enables the memory control circuit to be powered by the power voltage signal and operable to control the memory system, regardless of whether the power voltage signal does not reach the power voltage threshold.

15. The memory system according to claim 13, wherein the power-up verification state machine transitions from a first one of the states to a second one of the states when the first one of the states and any state previous to the first one of the states are passed in accordance with the sequence of states and any detection corresponding to the first one of the states is passed.

16. The memory system according to claim 13, wherein the power-up verification state machine activates the corresponding detections on the circuit units in accordance with the sequence of states and receives corresponding results of the detections from the circuit units in accordance with the sequence of states.

17. The memory system according to claim 13, wherein the memory system is a non-volatile memory system.

18. The memory system according to claim 17, wherein the memory system is a flash-based memory system.

* * * * *